United States Patent
Vega

(10) Patent No.: US 8,614,133 B2
(45) Date of Patent: Dec. 24, 2013

(54) STRUCTURE AND METHOD TO ENABLING A BORDERLESS CONTACT TO SOURCE REGIONS AND DRAIN REGIONS OF A COMPLEMENTARY METAL OXIDE SEMICONDUCTOR (CMOS) TRANSISTOR

(71) Applicant: International Business Machines Corporation, Armonk, NY (US)

(72) Inventor: Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/778,393

(22) Filed: Feb. 27, 2013

(65) Prior Publication Data

US 2013/0178035 A1    Jul. 11, 2013

Related U.S. Application Data

(62) Division of application No. 13/034,791, filed on Feb. 25, 2011, now Pat. No. 8,421,160.

(51) Int. Cl.
*H01L 21/336* (2006.01)
*H01L 29/78* (2006.01)

(52) U.S. Cl.
USPC ........... 438/300; 257/389; 257/401; 257/408; 257/E29.259; 257/E21.433; 438/303; 438/304

(58) Field of Classification Search
USPC .......... 257/389, 401, 408, E29.259, E21.433; 438/300, 303–305
See application file for complete search history.

(56) References Cited

U.S. PATENT DOCUMENTS

| | | | | |
|---|---|---|---|---|
| 6,346,447 B1* | 2/2002 | Rodder | ......................... | 438/300 |
| 6,515,338 B1* | 2/2003 | Inumiya et al. | ................ | 257/368 |
| 7,723,808 B2* | 5/2010 | Okuda et al. | .................. | 257/401 |
| 7,786,538 B2* | 8/2010 | Tsuchiaki | ..................... | 257/384 |
| 7,880,228 B2* | 2/2011 | Yasutake | ....................... | 257/344 |
| 8,169,024 B2* | 5/2012 | Cheng et al. | .................. | 257/347 |
| 8,350,338 B2* | 1/2013 | Clark et al. | ................... | 257/393 |
| 8,435,845 B2* | 5/2013 | Ning et al. | .................... | 438/186 |
| 2007/0072374 A1* | 3/2007 | Ono et al. | ...................... | 438/267 |

(Continued)

OTHER PUBLICATIONS

Hokazona, A., "Source/Drain Engineering for Sub-100nm CMOS Using Selective Epitaxial Growth Technique"; Electron Devices Meeting, 2000. IEDM Technical Digest. International; pp. 243-246.

(Continued)

*Primary Examiner* — Allan R Wilson
(74) *Attorney, Agent, or Firm* — Scully, Scott, Murphy & Presser, P.C.; H. Daniel Schnurmann

(57) ABSTRACT

A semiconductor device that includes a gate structure on a channel region of a semiconductor substrate. A first source region and a first drain region are present in the semiconductor substrate on opposing sides of the gate structure. At least one spacer is present on the sidewalls of the gate structure. The at least one spacer includes a first spacer and a second spacer. The first spacer of the at least one spacer is in direct contact with the sidewall of the gate structure and is present over an entire width of the first source region and the first drain region. The second spacer of the at least one spacer extends from the first spacer of the at least one spacer and has a length that covers an entire length of a first source region and a first drain region.

17 Claims, 6 Drawing Sheets

(56) References Cited

U.S. PATENT DOCUMENTS

2007/0128786 A1* 6/2007 Cheng et al. .................. 438/199
2010/0244154 A1* 9/2010 Yasutake ....................... 257/408
2012/0326241 A1* 12/2012 Haran et al. .................. 257/401

OTHER PUBLICATIONS

Yin, C., "An Air Spacer Technology for Improving Short-Channel Immunity of MOSFETs With Raised Source/Drain and High-k Gate Dielectric", IEEE, Electron Device Leters, vol. 26, No. 5, May 2005; pp. 323-325.

Nakahara, Y., "Ultra-shallow in-situ-doped raised source/drain structure for sub-tenth micron CMOS", 1996 Symposium on VLSI Technology. Digest of Technical Papers, pp. 174-175.

Cheng, K. "Fully Depleted Extremely Thin SOI Technology Fabricated by a Novel Integration Scheme Featuring Implant-Free, Zero-Silicon-Loss, and Faceted Raised Source/Drain" 2009 Symposium on VLSI Technology Digest of Technical Papers, pp. 212-213.

* cited by examiner

STRUCTURE AND METHOD TO ENABLING A BORDERLESS CONTACT TO SOURCE REGIONS AND DRAIN REGIONS OF A COMPLEMENTARY METAL OXIDE SEMICONDUCTOR (CMOS) TRANSISTOR

CROSS REFERENCE TO RELATED APPLICATION

This application is a divisional of U.S. patent application Ser. No. 13/034,791, filed Feb. 25, 2011 the entire content and disclosure of which is incorporated herein by reference.

BACKGROUND

The present disclosure relates generally to semiconductor integrated circuits (ICs). More particularly, the present disclosure relates to scaling of semiconductor devices, such as metal-oxide-semiconductor field effect transistors (MOSFETs).

In order to be able to make integrated circuits (ICs), such as memory, logic, and other devices, of higher integration density than currently feasible, one has to find ways to further downscale the dimensions of field effect transistors (FETs), such as MOSFETs, and complementary metal oxide semiconductors (CMOS). Scaling achieves compactness and improves operating performance in devices by shrinking the overall dimensions and operating voltages of the device while maintaining the device's electrical properties.

SUMMARY

In one embodiment, a semiconductor device is provided that includes a gate structure on a channel region of a semiconductor substrate. A first source region and a first drain region are present in the semiconductor substrate on opposing sides of the gate structure. At least one spacer is present on the sidewalls of the gate structure. The at least one spacer includes a first spacer and a second spacer. The first spacer of the at least one spacer is in direct contact with the sidewall of the gate structure and is present over an entire width of the first source region and the first drain region. The second spacer of the at least one spacer extends from the first spacer of the at least one spacer and has a length that covers an entire length of a first source region and a first drain region.

A second source region and a second drain region are in direct contact with a portion the first source region and the first drain region that is not underlying the at least one spacer, wherein the second source region and the second drain region are raised relative to the channel region of the semiconductor substrate.

In another aspect, a method of forming a semiconductor device is provided that includes forming a gate structure on a semiconductor substrate, wherein a first source region and a first drain region are on opposing sides of the gate structure. A first spacer is formed in direct contact with sidewalls of the gate structure. The first spacer has a first width that exposes a portion of the first source region and the first drain region. A second spacer is formed on the sidewalls of the gate structure. The second spacer has a second width that is less than the first width and covers the entire length of the first source region and the first drain region. A second source region and a second drain region are formed on the exposed portion of the first source region and the first drain region. The second source region and the second drain region have an upper surface that is raised relative to the channel region of the semiconductor substrate.

In another embodiment, a method of forming a semiconductor device is provided that includes forming a replacement gate structure on a semiconductor substrate, wherein a first source region and a first drain region are on opposing sides of the gate structure. A first spacer is formed on the sidewalls of the replacement gate structure. The first spacer has a first width that provides an exposed portion of the first source region and the first drain region. A second spacer is formed on the sidewalls of the gate structure. The second spacer has a second width that is less than the first width and covers the entire length of the first source region and the first drain region. A second source region and a second drain region are formed on the exposed portion of the first source region and the first drain region. The second source region and the second drain region have an upper surface that is raised relative to the channel region of the semiconductor substrate. The replacement gate structure may then be replaced with a functional gate structure.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 6A is a top down cross-sectional view along section line A-A as depicted in FIGS. 6B and 6C. FIG. 6B is a side cross-sectional view along section line B-B as depicted in FIG. 6A. FIG. 6C is a side cross-sectional view along section line B-B as depicted in FIG. 6A.

DETAILED DESCRIPTION

Figure 1:
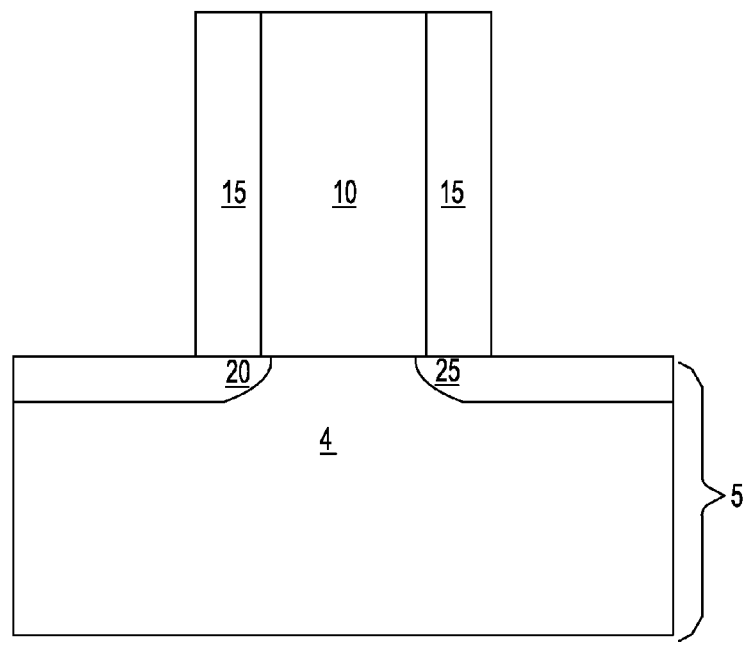
FIG. 1 is a side cross-sectional view depicting one embodiment of a forming a replacement gate structure on a semiconductor substrate, forming a first spacer on the sidewall of the replacement gate structure, and forming source extension regions and drain extension regions in the semiconductor substrate, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", "width", "length", "thickness" and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It has been determined that one consequence of scaling of semiconductor devices, such as field effect transistors (FETs), is that the distance between the silicide contact and the source and drain junctions is reduced as the overall dimensions of the semiconductor device are decreased. As the distance between the silicide contact and the source and drain junctions of semiconductor device decreases, leakage in the semiconductor device may increase. In some instances, semiconductor devices including raised source regions and raised drain regions may reduce the incidence of leakage. Semiconductor devices including raised source regions and raised drain regions typically display increased parasitic capacitance that is formed between the raised source regions/raised drain regions and the gate structure and the source/drain junctions. In one embodiment, the methods and structures of the present disclosure minimize semiconductor device leakage by utilizing raised source regions and raised drain regions, while decreasing the parasitic capacitance by utilizing at least one spacer that decreases the size of the raised source regions and raised drain regions that are adjacent to the gate structure.

FIGS. 1-6C depict one embodiment of a method of forming a semiconductor device including a raised source region and a raised drain regions. The semiconductor device includes at least one spacer that reduces the source and drain region surface portion of the semiconductor substrate that is available for the epitaxial growth processes that forms the raised source region and raised drain region. As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor, e.g., n-type or p-type conductivity.

In one embodiment, the semiconductor device is a field effect transistor (FET). A field effect transistor (FET) is a semiconductor device in which output current, i.e., source-drain current, is controlled by the voltage applied to a functional gate structure. A field effect transistor has three terminals, i.e., a functional gate structure, a source region (not shown) and a drain region (not shown). The functional gate structure is a structure used to control output current, i.e., flow of carriers in the channel, i.e., channel region, of a semiconducting device, such as a field effect transistor, through electrical or magnetic fields. The channel region is between the source region and the drain region of a field effect transistor (FET) that becomes conductive when the semiconductor device is turned on. The source region, is a doped region in the transistor, in which majority carriers are flowing into the channel region. The drain region is the doped region in transistor located at the end of the channel region, in which carriers are flowing out of the semiconductor device through the drain region. As used herein, the term "raised" as used to describe the source region and/or drain region means that the upper surface of at the source region and/or drain region is vertically offset and above from the channel region of the substrate. Although, FIGS. 1-6C of the present disclosure depict a field effect transistor (FET), any semiconductor device having raised source and drain regions and a conductive feature overlying a channel region of a semiconductor device is applicable to the present disclosure.

FIG. 1 illustrates the results of the initial processing steps that produce a replacement gate structure 10 on a semiconductor substrate 5. The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5.

Still referring to FIG. 1, replacement gate structure 10 is then formed atop the semiconductor substrate 5. In replacement gate technology, a sacrificial material dictates the geometry and location of the later formed functional gate structure. The replacement gate structure 10 is formed by first blanket depositing a layer of sacrificial material using a deposition process, such as chemical vapor deposition (CVD). Chemical vapor deposition (CVD) is a deposition process in which a deposited species is formed as a result of chemical reaction between gaseous reactants at room temperature or greater, wherein the solid product of the reaction is deposited on the surface on which a film, coating, or layer of the solid product is to be formed. Variations of CVD processes suitable for depositing the sacrificial material that provides the replacement gate structure 10 include, but are not limited to, Atmospheric Pressure CVD (APCVD), Low Pressure CVD (LPCVD) and Plasma Enhanced CVD (EPCVD), Metal-Organic CVD (MOCVD) and others.

The sacrificial material that provides the replacement gate structure 10 may be any material that can occupy the space in which the subsequently formed functional gate structure is to be positioned. Examples of materials for the replacement gate structure 10 include dielectrics such as, oxides, nitrides and oxynitride materials. In one embodiment, the replacement gate structure 10 is composed of silicon nitride. The replacement gate structure 10 may also be formed from semiconductor materials, such as polysilicon. Other materials can be employed for the replacement gate structure 10, so long as the replacement gate structure 10 may be removed selectively to at least the channel region 4 of the semiconductor substrate 5. The sacrificial material that provides the replacement gate structure 10 may have a thickness ranging from 80.0 nm to 200.0 nm.

The replacement gate structure 10 is then formed from the deposited layer of sacrificial material using photolithography and etching. More specifically, a pattern is produced on the sacrificial material by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. For example, a first material may be removed with a selectivity of greater than 100:1 to a second material. The replacement gate structure 10 is positioned on at least a channel region 4 of the semiconductor substrate 5.

FIG. 1 also depicts one embodiment of forming a first spacer 15 on the sidewall of the replacement gate structure 10, and forming source extension regions 20 and drain extension regions 25 in the semiconductor substrate 5. The first spacer 15 may be formed using deposition, photolithography and etch processes. In one embodiment, the material for the first spacer 15 is first blanket deposited over the replacement gate structure 10 and the exposed portions of the semiconductor substrate 5. The material for the first spacer 15 may be deposited as a conformal layer. As used herein, "a conformal layer", such as a conformal dielectric layer, is a deposited material having a thickness that remains the same regardless of the geometry of underlying features on which the layer is deposited. In one example, the thickness of the conformal layer that is deposited for the first spacer 15 varies by no greater than 20% of the average thickness for the layer.

In one embodiment, in which the material that is deposited for the first spacer 15 is a blanket deposited conformal dielectric layer, the material layer for the first spacer 15 may be formed using thermal growth or deposition. In one example, the material layer for the first spacer 15 is deposited using thermal oxidation and is composed of silicon oxide. In another example, the material layer for the first spacer 15 is formed by a deposition process, such as chemical vapor deposition (CVD). Variations of CVD processes suitable for the material layer for the first spacer 15 include but are not limited to Atmospheric Pressure CVD (APCVD), Low Pressure CVD (LPCVD) and Plasma Enhanced CVD (EPCVD), Metal-Organic CVD (MOCVD) and others. The thickness T1 of the material layer for the first spacer 15 is typically from 1.0 nm to 10.0 nm. In another embodiment, the material layer for the first spacer 15 has a thickness T1 that ranges from 2.0 nm to 5.0 nm. The lateral thickness T1 of the first spacer 15 is measured from the sidewall of the replacement gate structure 10 to the exterior sidewall of the first spacer 15.

Following deposition, the material layer for the first spacer 15 is etched to remove the portions of the material layer from the upper surfaces of the semiconductor substrate 5 that are not adjacent to the replacement gate structure 10, and from the upper surface of the replacement gate structure 10. The etch process for forming the first spacer 15 may be a spacer etch back process. In one example, the etch process for forming the first spacer 15 is an anisotropic etch. As used herein, an "anisotropic etch process" denotes a material removal process in which the etch rate in the direction normal to the surface to be etched is much higher than in the direction parallel to the surface to be etched. Examples of anisotropic etch process suitable for forming the first spacer 15 include, but are not limited to, reactive-ion etching (RIE), ion beam etching, plasma etching and/or laser ablation. Reactive ion etch (RIE) is a form of plasma etching, in which the surface to be etched may be placed on an RF powered electrode and takes on a potential that accelerates an etching species, which is extracted from a plasma, towards the surface to be etched, wherein a chemical etching reaction takes place in the direction normal to the surface being etched.

Following etching, the remaining portion of the material layer for the first spacer 15 is in direct contact with the sidewall of the replacement gate structure 10. The portion of the material layer for the first spacer 15 that is present on the upper surface of the replacement gate structure 10 may be removed so that the upper surface of the first spacer 15 is coplanar with the upper surface of the replacement gate structure 10.

Typically, the remaining portion of the material layer that provides the first spacer 15 provides a first spacer thickness T1 that ranges from 1.0 nm to 10.0 nm. In another embodiment, the remaining portion of the material layer that provides the first spacer 15 provides a first spacer thickness T1 that ranges from 2.0 nm to 5.0 nm. The remaining portion of the material layer that provides the first spacer 15 may be in direct contact with the entirety of the sidewall replacement gate structure 10. Therefore, in some embodiments, the first spacer 15 is present on the sidewalls adjacent to the source and drain regions, as well as the sidewalls of the gate structure along the length that separates the source and drain regions.

The material of the first spacer 15 is typically a dielectric material. For example, the material of the first spacer 15 may be an oxide, nitride or oxynitride material. In one example, the first spacer 15 is composed of silicon nitride. In another example, the first spacer 15 is composed of silicon oxide. It is noted that these materials are provided for illustrative examples only, and are not intended to limit the disclosure, since any material may be employed for the first spacer 15, so long as the material selected allows for the subsequently formed second spacer to be etched without removing the first spacer 15 in its entirety. Typically, the subsequently formed second spacer may be etched selectively to the first spacer 15.

Referring to FIG. 1, a source extension region 20 and a drain extension region 25 may be on opposing sides of the channel region 4. The conductivity-type of the source region and the drain region including a source extension region 20 and a drain extension region 25, determines the conductivity of the semiconductor device. The source and drain regions may each include a source and drain extension region, a deep source and drain region, and a raised source and drain region. Conductivity-type denotes whether the source region and the drain regions of the semiconductor device have been doped with a p-type or n-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous.

In one embodiment, the source extension region 20 and the drain extension region 25 are formed using an ion implantation process. In one embodiment, the dopant species for the source extension region 20 is boron (B) or $BF_2$. Boron may be implanted utilizing implant energies ranging from 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and a dose ranging from $5 \times 10^{14}$ atoms/cm$^2$ to $5 \times 10^{15}$ atoms/cm$^2$. In one embodiment, a typical implant for the n-type extension drain region 25 is arsenic. The n-type extension drain region 25 can be implanted with arsenic using implant energies ranging from 1.0 keV to 10.0 keV with a dose ranging from $5 \times 10^{14}$ atoms/cm$^2$ to $5 \times 10^{15}$ atoms/cm$^2$. Typically, the dopant concentration of the source extension region 20 and the drain extension region 25 having p-type dopant ranges from $5 \times 10^{19}$ atoms/cm$^3$ to $5 \times 10^{20}$ atoms/cm$^3$. In another embodiment, the dopant concentration of the source extension region 20 and the drain extension region 25 having p-type dopant ranges from $7 \times 10^{19}$ atoms/cm$^3$ to $2 \times 10^{20}$ atoms/cm$^3$.

Figure 2:
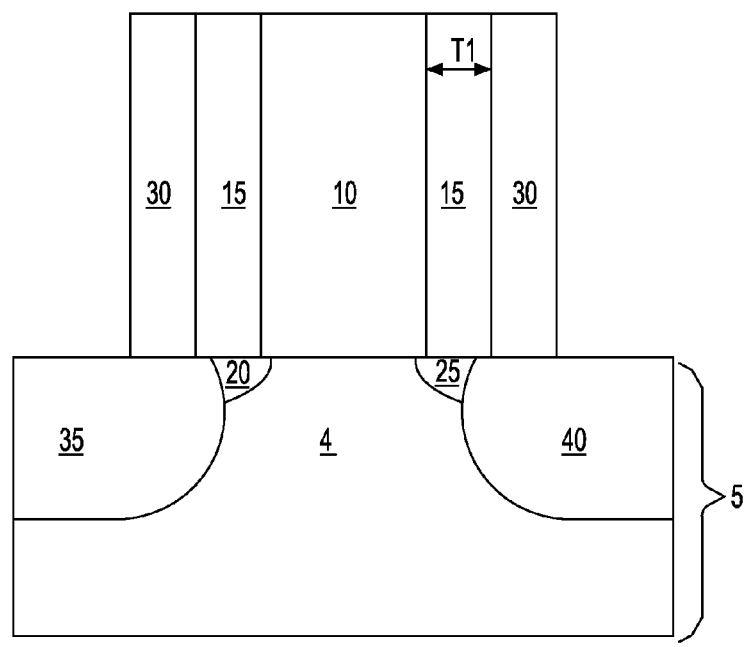
FIG. 2 is a side cross-sectional view depicting forming a sacrificial spacer on the sidewall of the first spacer, and forming deep source regions and deep drain regions in the semiconductor substrate, in accordance with the present disclosure.

FIG. 2 depicts one embodiment of forming a sacrificial spacer 30 on the sidewall of the first spacer 15, and forming a deep source region 35 and a deep drain region 40 in the semiconductor substrate 5. The sacrificial spacer 30 is formed in direct contact with the sidewalls of the first spacer 15 using deposition and etch processes. In one example, the process sequence for forming the sacrificial spacer 30 may be similar to the process sequence for forming the first spacer 15. Therefore, the above description of forming the first spacer 15 that is described above with reference to FIG. 1, is applicable for forming the sacrificial spacer 30, as depicted in FIG. 2.

The material for the sacrificial spacer 30 is selected so that it may be etched selectively to the first spacer 15, the replacement gate structure 10 and the semiconductor substrate 5. For example, when the first spacer 15 is composed of silicon oxide ($SiO_2$), the sacrificial spacer 30 may be composed of silicon nitride ($Si_3N_4$). In another example, when the first spacer 15 is composed of silicon nitride ($Si_3N_4$), the sacrificial spacer 30 may be composed of silicon oxide ($SiO_2$). The thickness of the sacrificial spacer 30 dictates the distance from the replacement gate structure 10 at which the dopant to form the deep source region 35 and deep drain region 40 is implanted into the semiconductor substrate 5. Typically, the sacrificial spacer 30 has a sacrificial spacer thickness that ranges from 1.0 nm to 10.0 nm. In another embodiment, the sacrificial spacer thickness ranges from 2.0 nm to 5.0 nm.

The deep dopant regions, i.e., deep source region 35 and deep drain region 40, typically have the same conductivity dopant as the source extension region 20 and the drain extension region 25. In some embodiments, the deep source region 35 and the deep drain region 40 are optional, and may be omitted. The dopant for the deep source region 35 and the deep drain region 40 is present in greater concentration and at greater depths into the semiconductor substrate 5 than the dopant for the source extension region 20 and the drain extension region 25. In some embodiments, the dopant may be introduced into the semiconductor substrate 5 by ion implantation. In some embodiments, a halo implant (not shown) may also be formed at the corner of the junction opposite the upper surface of the channel region 4. The halo implant region is typically of an opposite conductivity, as the source and drain extension regions 20, 25, and the deep source and drain regions 35, 40. In one example, the source extension region 20 may be referred to as a first source region, and the drain extension region 25 may be referred to as a first drain region. In another example, the source extension region 20 and the deep source region 35 may collectively be referred to as a first source region, and the drain extension region 25 and the deep drain region 40 may be collectively referred to as a first drain region.

The sacrificial spacer 30 may then be removed. The sacrificial spacer 30 may be removed by an etch process that is selective to the first spacer 15, the semiconductor substrate 5, and the replacement gate structure 10. In the embodiments in which the sacrificial spacer 30 is not removed (not shown), the sacrificial spacer 30 remains positioned between the first spacer 15 and the subsequently formed second spacer.

The source and drain regions, i.e., the source and drain extension regions 20, 25 and the deep source and drain regions 35, 40, are typically activated by activation annealing using an annealing processes such as, but not limited to, rapid thermal annealing, furnace annealing, flash lamp annealing or laser annealing. In one embodiment, activation anneal can be conducted at a temperature ranging from 850° C. to 1350° C.

Figure 3:
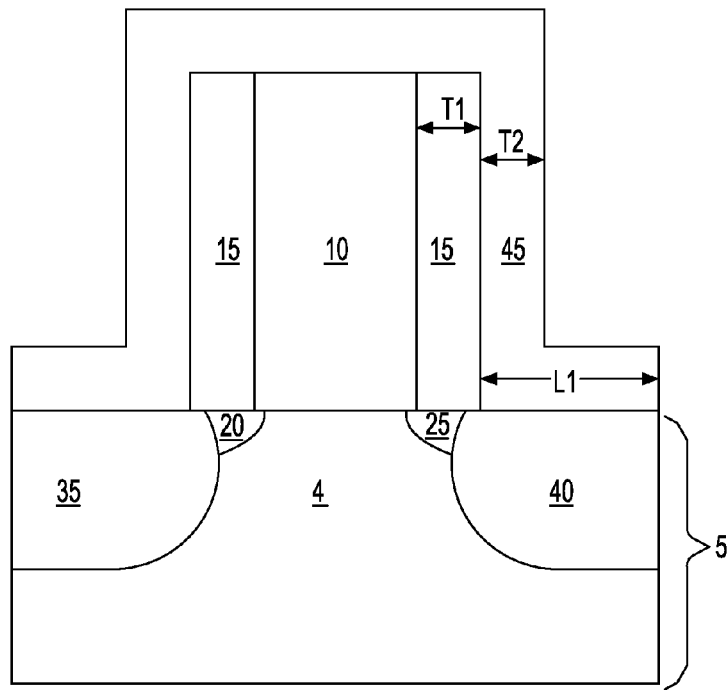
FIG. 3 is a side cross-sectional view depicting forming a conformal dielectric layer over at least the replacement gate structure and the first spacer, in accordance with the present disclosure.

FIG. 3 depicts one embodiment of forming a conformal dielectric layer 45 over at least the replacement gate structure 10, the first spacer 15 and the exposed upper surface of the semiconductor substrate 5, in which the source and drain extension regions 20, 25, as well as the deep source and drain regions 35, 40, are present. The conformal dielectric layer 45 may be formed using thermal growth or deposition. In one example, the conformal dielectric layer 45 is formed using thermal oxidation and is composed of silicon oxide. In another example, the conformal dielectric layer 45 is formed by a deposition process, such as chemical vapor deposition (CVD). Variations of CVD processes suitable for depositing the conformal dielectric layer 45 include, but are not limited to, Atmospheric Pressure CVD (APCVD), Low Pressure CVD (LPCVD) and Plasma Enhanced CVD (EPCVD), Metal-Organic CVD (MOCVD) and others. The thickness T2 of the material layer for the conformal dielectric layer 45 typically ranges from 1.0 nm to 10.0 nm. In another embodiment, the material layer for the conformal dielectric layer 45 has a thickness T2 that ranges from 2.0 nm to 5.0 nm.

The material of the conformal dielectric layer 45 is typically a dielectric material. For example, the material of the conformal dielectric layer 45 may be an oxide, nitride or oxynitride material. In one embodiment, the conformal dielectric layer 45 is composed of silicon nitride. The conformal dielectric layer 45 may be composed of the same or a different material as the first spacer 15. In some embodiments, the material for the conformal dielectric layer 45 is selected so that it may be etched selectively to the first spacer 15, the replacement gate structure 10 and the semiconductor substrate 5. In one example, when the first spacer 15 is composed of silicon oxide ($SiO_2$), the conformal dielectric layer 45 may be composed of silicon nitride ($Si_3N_4$). In another example, when the first spacer 15 is composed of silicon nitride ($Si_3N_4$), the conformal dielectric layer 45 may be composed of silicon oxide ($SiO_2$). It is noted that these materials are provided for illustrative examples only, and are not intended to limit the disclosure, since any material may be employed for the conformal dielectric layer 45, so long as the material selected allows for the conformal dielectric layer 45 to be etched without removing the first spacer 15 in its entirety. In some embodiments, the conformal dielectric layer 45 may be etched selectively to the first spacer 15. In other embodiments, the conformal dielectric layer 45 does not need to be etched with an etch that is selective to the first spacer 15.

Figure 4A:
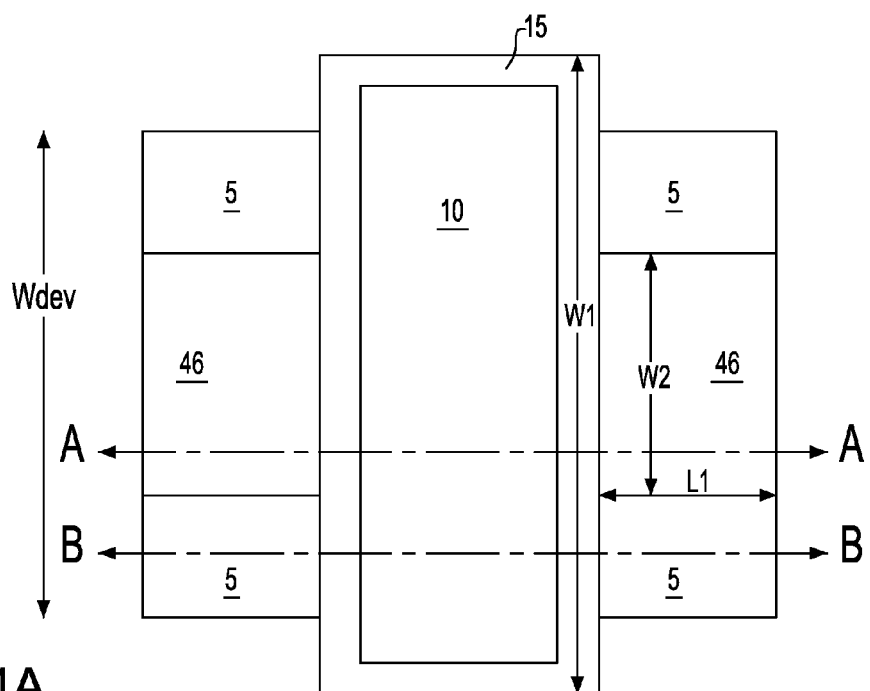
FIG. 4A is a planar top down view depicting removing a portion of the conformal dielectric layer to form a second spacer on a portion of the first spacer, in accordance with the present disclosure.
Figure 4B:
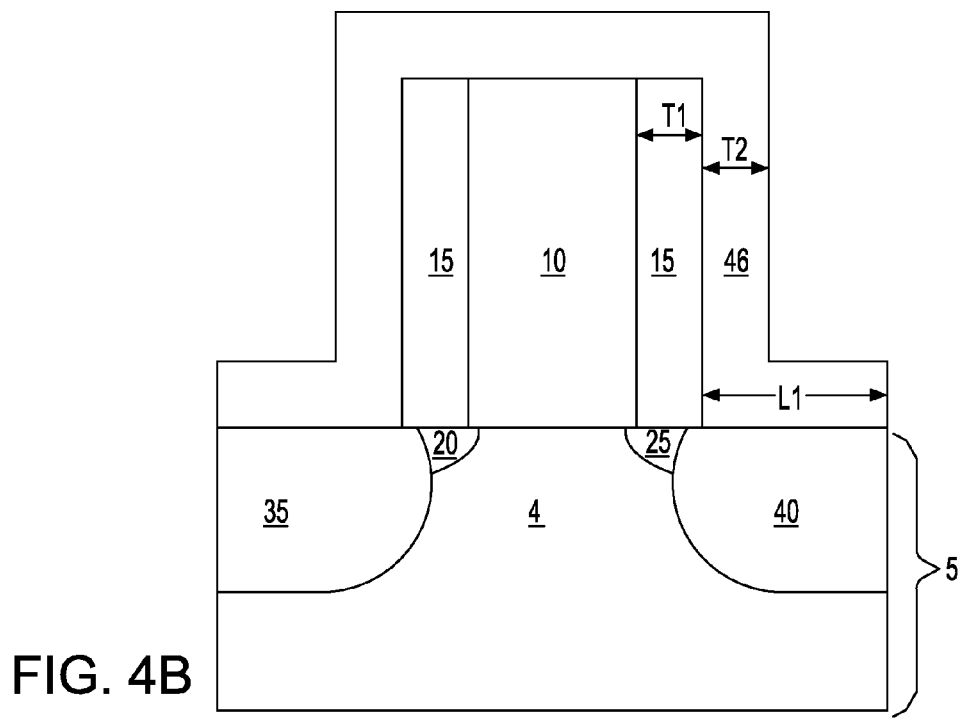
FIG. 4B is a side cross-sectional view depicting the structure depicted in FIG. 4A along section line A-A, in accordance with the present disclosure.
Figure 4C:
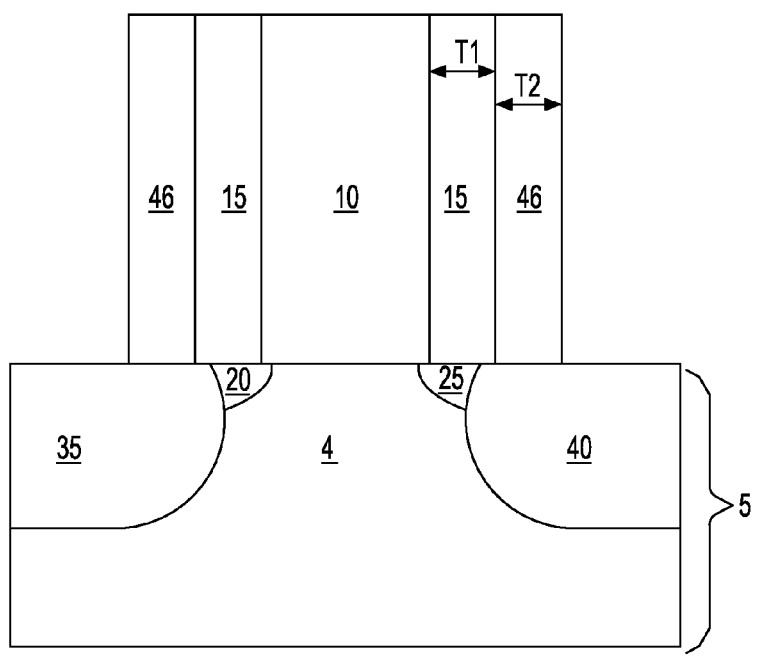
FIG. 4C is a side cross-sectional view depicting the structure depicted in FIG. 4A along section line B-B, in accordance with the present disclosure.

Referring to FIGS. 4A, 4B and 4C, at least a portion of the conformal dielectric layer is removed by an etch that is selective to the first spacer 15 to provide a second spacer 46. The remaining portion of the conformal dielectric layer that provides the second spacer 46 is in direct contact with at least the sidewalls of the first spacer 15. In some embodiments, a portion of the second spacer 46 is present on an upper surface of the replacement gate structure 10. The process for forming the second spacer 46 may include deposition, photolithography and etching.

For example, a photoresist block mask can be formed by applying a photoresist layer to the surface of the conformal dielectric layer, exposing the photoresist layer to a pattern of radiation, and then developing the pattern into the photoresist layer utilizing a resist developer. In one example, the photoresist block mask is formed on the portion of the conformal dielectric layer that remains to form the second spacer 46. The exposed portions of the conformal dielectric layer are then removed using a selective etch process. More specifically, the exposed portions of the conformal dielectric layer are removed with an etch chemistry that is selective to at least the photoresist block mask and the first spacer 15. In some embodiments, the etch that removes the conformal dielectric layer is also selective to the semiconductor substrate 5. The etch process for removing the exposed portions of the conformal dielectric layer may be an anisotropic etch process, such as reactive ion etch (RIE). Other examples of anisotropic etch processes that are suitable for removing the exposed portions of the conformal dielectric layer include ion beam etching, plasma etching and/or laser ablation.

In some embodiments, the portion of the conformal dielectric layer that remains provides the second spacer 46, and is positioned to obstruct the epitaxial growth of the subsequently formed raised source region and raised drain region. In one embodiment, the central portion of the conformal dielectric layer is protected by the photoresist mask to remain and provide the second spacer 46, in which the end portions of the semiconductor substrate 5 including at least the source extension regions 20 and the drain extension regions 25 are exposed. In this embodiment, the second spacer 46 is positioned in direct contact with the middle of the length of the first spacer 15. In another embodiment, the end portions of the conformal dielectric layer is protected by the photoresist mask to remain and provide the second spacers 46, in which the center portion of the semiconductor substrate 5 including at least the source extension regions 20 and the drain extension regions 25 are exposed.

Referring to FIG. 4B, the remaining portion of the conformal layer that provides the second spacer 46 may be present on the sidewalls of the first spacer 15, the upper surface of the replacement gate structure 10, and the upper surface of the semiconductor substrate 5. The thickness T2 of the remaining portion of the conformal dielectric layer that provides the second spacer 46 on the sidewalls of the first spacer 15, the upper surface of the replacement gate structure 10 and the upper surface of the semiconductor substrate 5 may range from 1.0 nm to 10.0 nm. In another embodiment, the thickness T2 of the remaining portion of the conformal dielectric layer that provides the second spacer 46 on the sidewalls of the first spacer 15, the upper surface of the replacement gate structure 10 and the upper surface of the semiconductor substrate 5 ranges from 2.0 nm to 5.0 nm.

Referring to FIG. 4A, the width W1 of the first spacer 15 is typically greater than the width W2 of the second spacer 46. The first spacer 15 typically has a width W1 ranging from 60 nm to 1000 nm. In another embodiment, the first spacer 15 has a width W1 ranging from 100 nm to 200 nm. The second spacer 46 typically has a width W2 ranging from 20 nm to 960 nm. In another embodiment, the second spacer 46 has a width W2 ranging from 60 nm to 160 nm.

In the embodiment depicted in FIG. 4A, the central portion of the conformal dielectric layer is protected during the etch process that forms the second spacer 46, in which the second spacer 46 is positioned at substantially the center of the width W2 of the first spacer 15. Referring to FIG. 4A, when viewed from a top to down planar perspective, the second spacer 46 intercepts the first spacer 15 to provide a t-shaped geometry. In another embodiment (not shown), the second spacer 46 intercepts on the ends of first spacer 15 to provide a U-shaped geometry when viewed from a top to down planar perspective.

The second spacer 46 is present overlying the portions of the semiconductor substrate 5 including the source and drain regions, i.e., deep source region 35, deep drain region 40, source extension region 20 and the drain extension region 25. By increasing the amount of the source and drain regions 35, 40 that is covered by the second spacer 46, the amount of available semiconductor surfaces to support epitaxial growth is decreased. Referring to FIGS. 4A and 4B, the remaining portion of the conformal dielectric layer that provides the second spacer 46 has a length L1 that covers the entire length of the underlying source and drain regions, i.e., deep source region 35, deep drain region 40, source extension region 20 and the drain extension region 25, corresponding to the width W2 of the spacer. The length of the source and drain region is in the direction that is parallel to the channel length. The channel length is the dimension separating the source region from the drain region.

Increasing the amount of the deep source region 35, the deep drain region 40, the source extension region 20 and the drain extension region 25 that is covered by the second spacer 46 decreases the available area for the epitaxial growth of the subsequently formed raised source region and the raised drain region. By decreasing the available area for the epitaxial growth of the subsequently formed raised source and drain regions, reduces the amount of material that may be grown for the raised source and drain regions. Wdev is a measurement of the width of the semiconductor device.

Figure 5A:
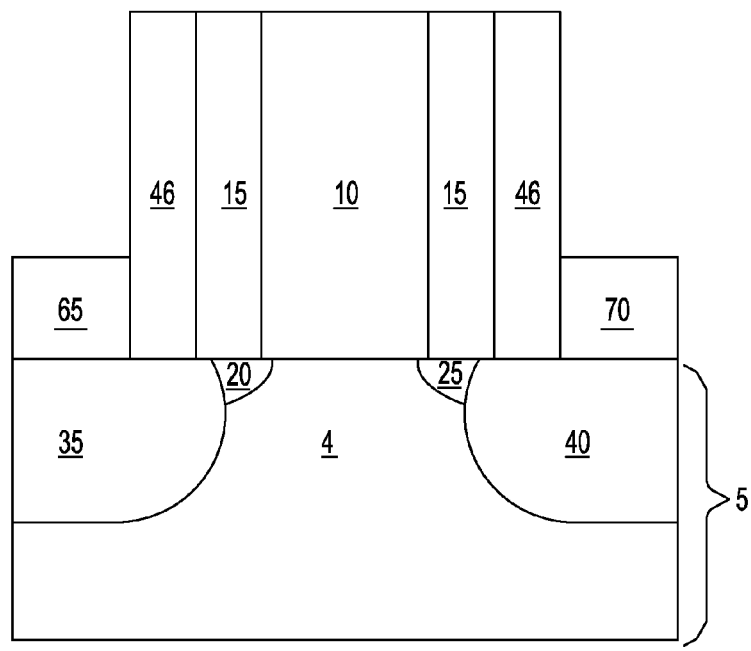
FIG. 5A is a side cross-sectional view depicting forming a raised source region and a raised drain region on the source extension region and the drain extension region, in accordance with one embodiment of the present disclosure.
Figure 5B:
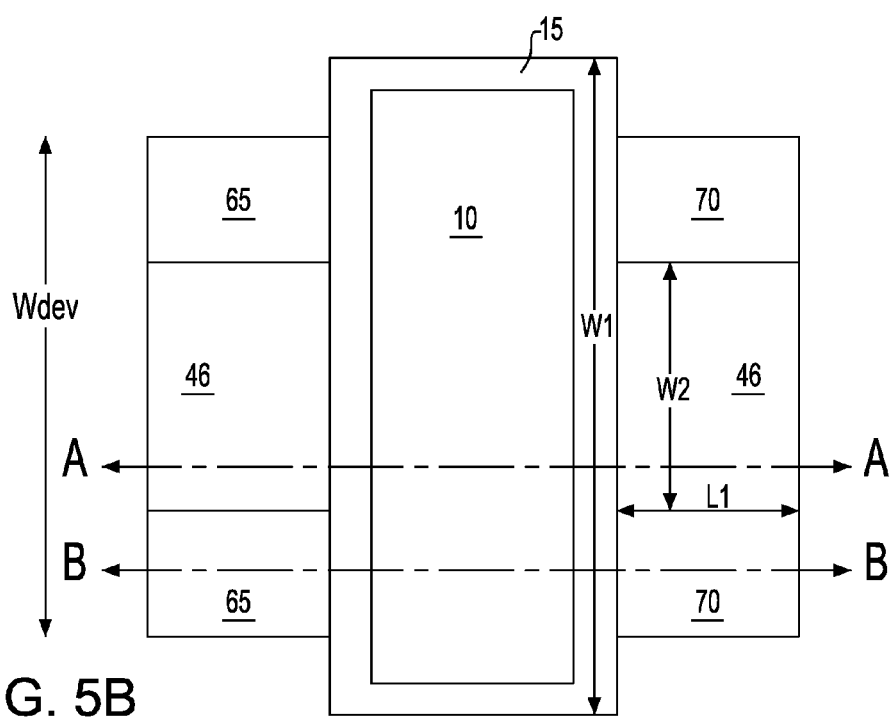
FIG. 5B is a planar top down view of the structure depicted in FIG. 5A, in accordance with one embodiment of the present disclosure.

FIGS. 5A and 5B depict one embodiment of forming a raised source region 65 and a raised drain region 70 on the portion of the semiconductor substrate 5 including at least the source extension region 20 and the drain extension region 25. FIGS. 5A and 5B depict one embodiment of selectively forming raised source region 65 and a raised drain region 70. "Selective" as used in combination with the terms formation, growth and/or deposition means that a semiconductor material is formed onto another semiconductor material without being formed on the surrounding insulating areas, such as the second spacer 46. Therefore, in the embodiment depicted in FIGS. 5A and 5B, the remaining portion of the conformal dielectric layer that provides the second spacer 46 obstructs the raised source region 65 and the raised drain region 70 from being formed over the portion of the semiconductor substrate 5 that is underlying the first spacer 15 and the second spacer 46.

In one embodiment, the raised source region 65 and the raised drain region 70 are composed of epitaxially formed material that is formed in direct contact with the exposed upper surface of the semiconductor substrate 5 that contains a portion of the source and drain extension regions 20, 25, and a portion of the deep source and drain regions 35, 40. "Epitaxial growth and/or deposition" means the growth of a semiconductor material on a deposition surface of a semiconductor material, in which the semiconductor material being grown has the same crystalline characteristics as the semiconductor material of the deposition surface.

The raised source region 65 and the raised drain region 70 may be composed of a silicon-containing material. In one embodiment, the raised source region 65 and the raised drain region 70 are composed of silicon. The silicon may be single crystal, polycrystalline or amorphous. The raised source region 65 and the raised drain region 70 may also be composed of a germanium containing material. In one embodiment, the raised source region 65 and the raised drain region 70 are composed of germanium. The germanium may be single crystal, polycrystalline or amorphous. In another example, the raised source region 65 and the raised drain region 70 may be composed of SiGe.

A number of different sources may be used for the selective deposition of silicon. Silicon sources for growth of silicon (epitaxial or poly-crystalline) include silicon tetrachloride, dichlorosilane ($SiH_2Cl_2$), and silane ($SiH_4$). The temperature for epitaxial silicon deposition typically ranges from 550° C. to 900° C. Higher temperature typically results in faster deposition, the faster deposition may result in crystal defects and film cracking.

The raised source region 65 and the raised drain region 70 may have a thickness ranging from 5 nm to 80 nm, as measured from the upper surface of the semiconductor substrate 5. In another embodiment, the raised source region 65 and the raised drain region 70 has a thickness ranging from 10 nm to 50 nm, as measured from the upper surface of semiconductor substrate 5. In yet another embodiment, the raised source region 65 and the raised drain region 70 has a thickness ranging from 10 nm to 20 nm, as measured from the upper surface of the semiconductor substrate 5.

In one embodiment, p-type semiconductor devices are produced by doping raised source region 65 and the raised drain region 70 with elements from group III of the Periodic Table of Elements. In one embodiment, the group III element is boron, aluminum, gallium or indium. In one embodiment, the dopant for the p-type raised source and drain region 65, 70 may be present in a concentration ranging from $1\times10^{20}$ atoms/cm$^3$ to $1\times10^{21}$ atoms/cm$^3$. In another embodiment, in which the raised source region 65 and the raised drain region 70 is doped to provide a p-type conductivity, the dopant may be present in a concentration ranging from 3E20 atoms/cm$^3$ to 6E20 atoms/cm$^3$. To provide an n-type conductivity, the raised source and drain regions 65, 70 may be doped with an n-type dopant, such as, antimony, arsenic and phosphorous. The dopant concentration of the raised source region 65 and the raised drain region 70 having the n-type conductivity may range from $1\times10^{19}$ atoms/cm$^3$ to $2\times10^{21}$ atoms/cm$^3$. In another embodiment, the extension regions 14a, 14b, 15a, 15b having the n-type conductivity ranging from $2\times10^{19}$ atoms/cm$^3$ to $5\times10^{20}$ atoms/cm$^3$.

Figure 6A:
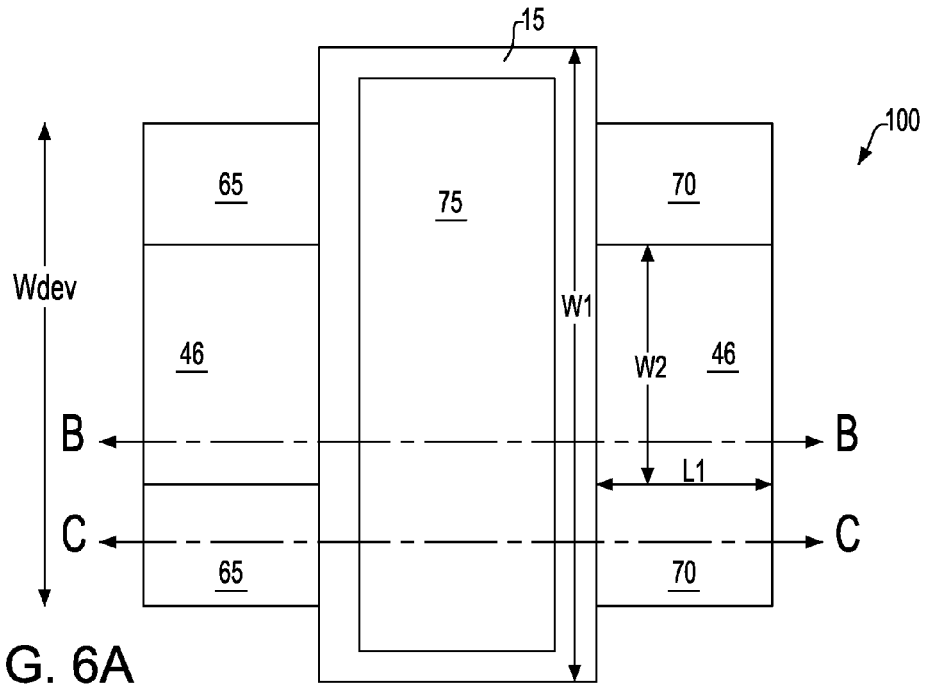
FIGS. 6A-6C depicting removing the replacement gate structure and forming a functional gate structure of the channel region of the semiconductor substrate, in accordance with the present disclosure.
Figure 6B:
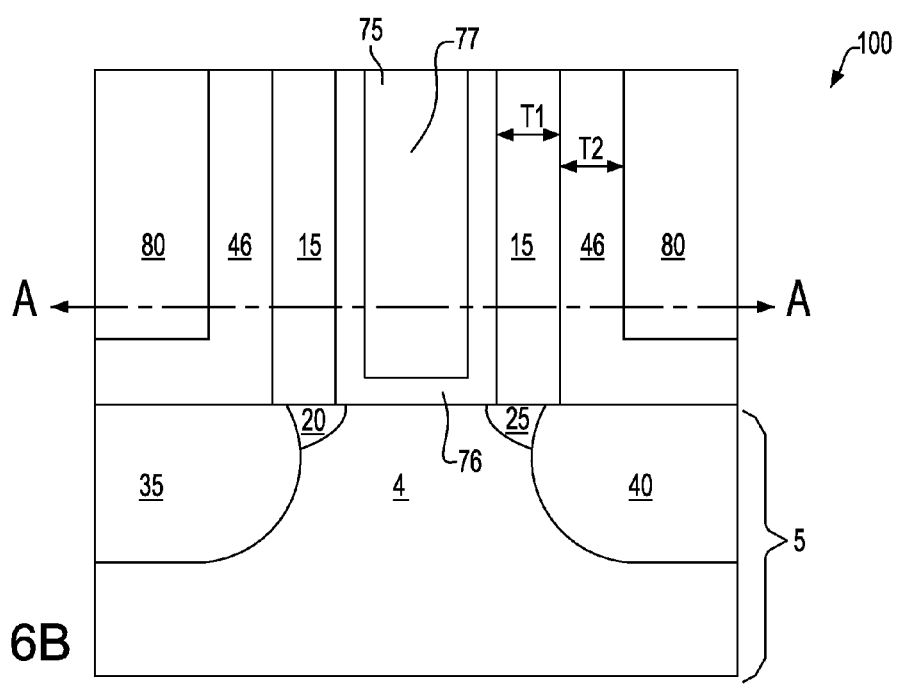
Figure 6C:
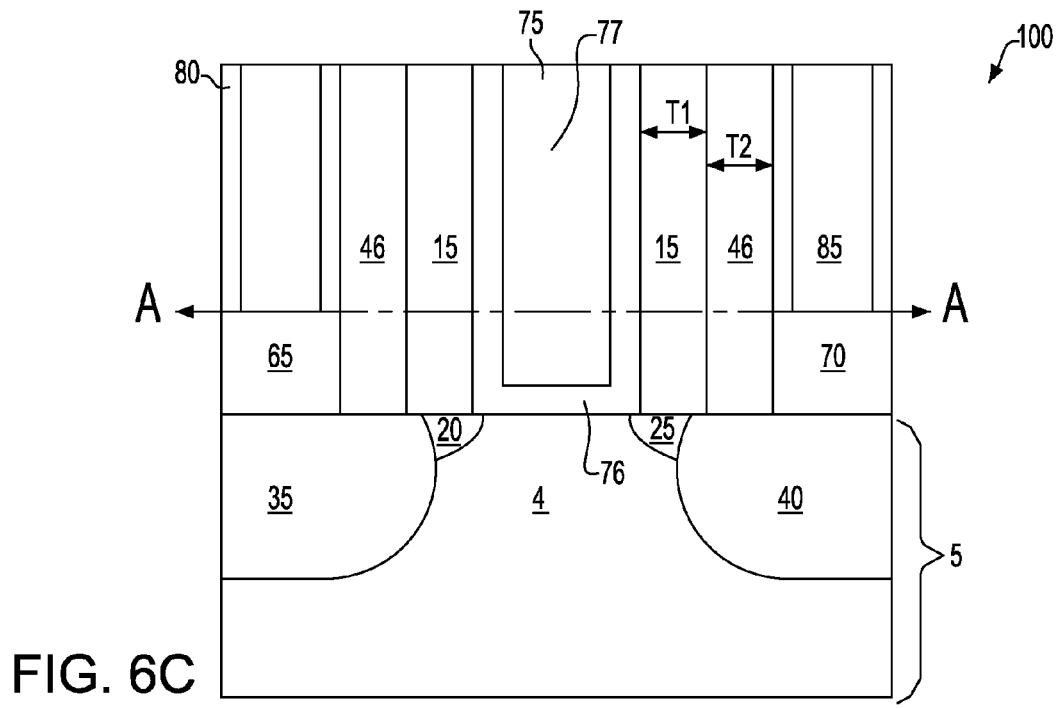

FIGS. 6A, 6B and 6C depict one embodiment of removing the replacement gate structure 10, and forming a functional gate structure 75 on the channel region 4 of the semiconductor substrate 5. In one embodiment, an interlevel dielectric layer 80 is deposited atop the structure depicted in FIGS. 5A and 5B. The composition of the interlevel dielectric layer 80 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 80 include, any of the aforementioned materials in porous form, or in a form that changes during processing to or from being porous and/or permeable to being non-porous and/or non-permeable. The interlevel dielectric layer 80 may be deposited using chemical vapor deposition (CVD). In addition to chemical vapor deposition (CVD), the interlevel dielectric layer 80 may also be formed using spinning from solution, spraying from solution, and evaporation.

Following deposition, the interlevel dielectric layer 80 is planarized until the upper surface of the replacement gate structure 10 is exposed. "Planarization" is a material removal process that employs at least mechanical forces, such as frictional media, to produce a planar surface. In one embodiment, the planarization process includes chemical mechanical polishing (CMP) or grinding. Chemical mechanical planarization (CMP) is a material removal process using both chemical reactions and mechanical forces to remove material and planarize a surface.

The replacement gate structure 10 is removed to provide an opening to the channel region 4 of the semiconductor substrate 5. The replacement gate structure 10 is typically removed using a selective etch process that removes the replacement gate structure 10 selective to the semiconductor substrate 5, the first spacer 15 and the interlevel dielectric layer 80. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch.

A functional gate structure 75 is formed in the opening to the channel region 4 of the semiconductor substrate 5. In one embodiment, a gate dielectric 76 is formed on the exposed upper surface of channel region 4 of the semiconductor substrate 5. The gate dielectric 76 may be composed of a high-k dielectric material. The term "high-k" denotes a material having a dielectric constant that is greater than the dielectric constant of silicon oxide ($SiO_2$) at room temperature, i.e., 20° C. to 25° C. In one embodiment, the high-k dielectric that provides the gate dielectric 76 is comprised of a material having a dielectric constant that is greater than 4.0, e.g., 4.1. In another embodiment, the high-k gate dielectric that provides the gate dielectric layer 76 is comprised of a material having a dielectric constant greater than 7.0. In yet another embodiment, the high-k gate dielectric that provides the gate dielectric layer 37 is comprised of a material having a dielectric constant ranging from greater than 4.0 to 30. The dielectric constants mentioned herein are relative to a vacuum at room temperature, i.e., 20° C. to 25° C.

In one example, a high-k gate dielectric 76 is provided by hafnium oxide ($HfO_2$). Other examples of suitable high-k dielectric materials for the gate dielectric 76 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the gate dielectric 76 is formed using a deposition process, such as chemical vapor deposition (CVD). In another embodiment, the gate dielectric 76 may be formed by a thermal growth process such as, for example, oxidation, nitridation or oxynitridation. The gate dielectric 76 may have a thickness ranging from 1 nm to 5 nm. In another embodiment, the gate dielectric 76 has a thickness ranging from 1 nm to 2.5 nm. In yet another example, the gate dielectric 76 has a thickness that ranges from 15 Å to 20 Å.

A gate conductor 77 is formed on the gate dielectric 76 filling the opening to the channel region 4 of the semiconductor substrate 5. In one embodiment, the gate conductor 77 is composed of a metal, such as a work function metal layer. In one embodiment, in which the semiconductor device is an n-type semiconductor device, the work function metal layer that provides the gate conductor 77 is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering.

In another embodiment, the work function metal layer may be a p-type work function metal layer. As used herein, a "p-type work function metal layer" is a metal layer that effectuates a p-type threshold voltage shift. In one embodiment, the work function of the p-type work function metal layer 24 ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In another embodiment, the gate conductor 77 is provided by a doped semiconductor, such as n-type doped polysilicon. In one embodiment, the gate conductor 77 is planarized until the upper surface of the gate conductor 36 is coplanar with the upper surface of the interlevel dielectric 11, as depicted in FIG. 3. In some examples, the gate conductor 36 may be planarized using chemical mechanical planarization (CMP).

Referring to FIGS. 6A-6C, at this stage of the present disclosure a semiconductor device 100 has been provided that includes a functional gate structure 75 on a semiconductor substrate 5. A first source region, e.g., source extension region 20 and deep source region 35, and a first drain region, e.g., drain extension region 25 and deep drain region 40, are present in the semiconductor substrate 5 on opposing sides of the channel region 4. At least one spacer, e.g., first spacer 15 and second spacer 46, is present on the sidewalls of the functional gate structure 75.

The first spacer 15 is in direct contact with the sidewall of the functional gate structure 75 and is present over an entire width W1 of the first source region, and the first drain region. The second spacer 46 extends from the first spacer 15 and has a length L1 that covers an entire length of a first source region, e.g., source extension region 20 and deep source region 35, and a first drain region, e.g., drain extension region 25 and deep drain region 40. A second source region, e.g., raised source region 65, and a second drain region, e.g., raised drain region 70, is present in direct contact with the first source region and the first drain region that is not directly under the first spacer 15 and the second spacer 46.

The at least one spacer is present on the sidewalls of the functional gate structure 75. The at least one spacer has a first spacer 15 with a first width W1, and a second spacer 45 with a second width W2, in which the second width W2 is less than the first width W1. The functional gate structure 75 is separated from the raised source and drain regions 65, 70 by the at least one spacer. The raised source region 65 and the raised drain region 70 are in direct contact with the first spacer 15 having the first width W1 and is in direct contact with the second spacer 46 having the second width W2.

Referring to FIGS. 6A-6C, the first spacer 15 of the at least one spacer has a thickness T1 that is measured from the sidewall of the functional gate structure 75 that is in direct contact with the first spacer 15 to the exterior face of the first spacer 15. Referring to FIGS. 6A and 6C, the second spacer 46 of the at least one spacer has a thickness T2 that is measured from the sidewall of the functional gate structure 75 that is in direct contact with the first spacer 15 to the exterior sidewall of the second spacer 46. In one embodiment, the thickness of the second spacer 46 is selected to cover the entire length of the portion of the semiconductor substrate 5 that contains the extension source and drain regions 20, 25, as well as the deep source and drain regions 35, 40. By covering the entire length of the portion of the semiconductor substrate 5 that contains the source and drain extension regions 20, 25 and the deep source and drain regions 35, 40, the second spacer 46 reduces the portion of raised source and drain region 65, 70 that is in direct contact with the portion of the semiconductor substrate 5 that contains the source and drain extension regions 20, 25 and the deep source and drain regions 35, 40. Further, the second spacer 46 limits the portion of the raised source and drain region 65, 70 that is adjacent to the functional gate structure 75.

The raised source and drain regions 65, 70 are present only over a fraction of the width of the source and drain regions, i.e., source extension region 20, drain extension region 25, deep source region 35, and deep drain region 40, of the semiconductor device 100. For example, in the embodiment depicted in FIGS. 6A-6C, the second spacer 46 covers approximately 33% of the entire surface area of the source and drain regions, i.e., source extension region 20, drain extension region 25, deep source region 35, and deep drain region 40. In this example, in comparison to a similarly prepared semiconductor device that does not include the spacer arrangement that is depicted in FIGS. 6A-6C, the second spacer 46 reduces the volume of the subsequently formed raised source and drain regions 65, 70 by approximately 33%. By reducing the volume of the raised source and drain regions 65, 70 that are adjacent to the functional gate structure, the present disclosure reduces the parasitic capacitance of the semiconductor device 100. In this example, the parasitic capacitance is reduced by approximately 33%.

Figure 7:
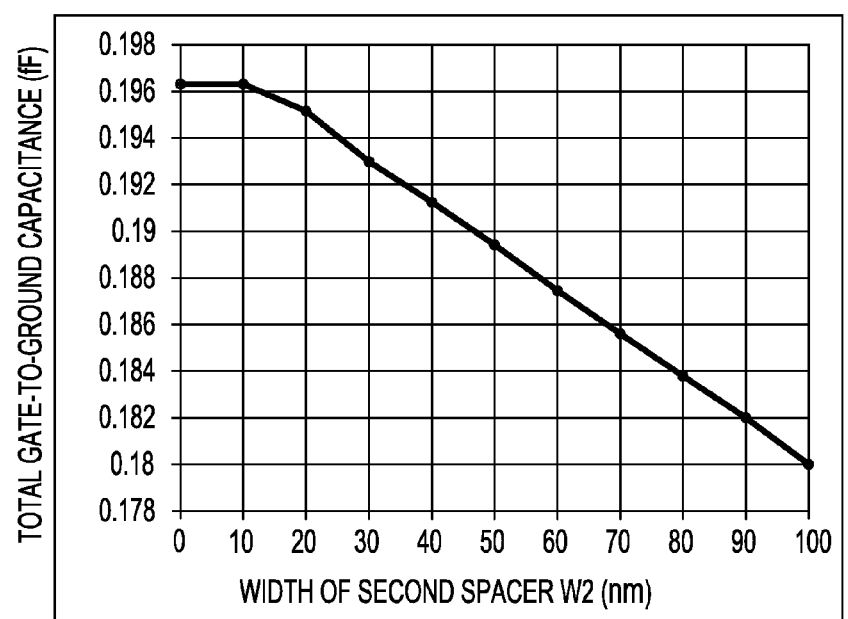
FIG. 7 is a plot of the total gate to ground capacitance (fF) as a function of the width of the second spacer.

FIG. 7 illustrates a plot of the total gate to ground capacitance (fF) as a function of the width W2 of the second spacer. In one embodiment, as the width W2 of the second spacer is increased from 0 to 10 nm, the capacitance typically does not change. This is because, although we are reducing some RSD region along the sidewall gate structure, that portion of the gate sidewall now has fringing electric fields which terminate on the newly-exposed part of the RSD region, which extends along the length of the source/drain region (i.e., the source- and drain-side RSD regions are now split into two regions. In this example, as the width W2 of the second spacer is increased to greater than 10 nm, the capacitance decreases linearly with an increase in the width W2 of the second spacer. FIG. 7 is a plot is the total capacitance, of which the parasitic capacitance is a fraction, but it can be reasonably stated to a first order that the reduction in parasitic capacitance is proportional to the ratio of the width W2 of the second spacer to the width Wdev of the device.

Referring to FIGS. 6A, 6B, and 6C, following the formation of the functional gate structure 75, via openings 78 may be formed through the interlevel dielectric layer 80 to expose an upper surface of the raised source and drain regions 65, 70. The via openings 78 may be formed using photolithography and etch processes. For example, a photoresist etch mask can be produced by applying a photoresist layer to the upper surface of the interlevel dielectric layer 80, exposing the photoresist layer to a pattern of radiation, and then developing the pattern into the photoresist layer utilizing a resist developer. The photoresist etch mask may be positioned so that portions of the interlevel dielectric layer 80 are not protected by the photoresist etch mask in order to provide the via openings 78. The exposed portion of the interlevel dielectric layer 80 is then removed by a selective etch. In one embodiment, the selective etch removes the material of the interlevel dielectric layer selectively to the upper surface of the raised source region 65 and the raised drain region 70.

At least a portion of the raised source and drain regions 65, 70 may then be converted into a metal semiconductor alloy. In one embodiment, the metal semiconductor alloy is composed of silicon and an elemental metal, which is hereafter referred to as a silicide. Silicide formation typically requires depositing a refractory metal such as cobalt, nickel, or titanium onto the surface of a Si-containing material. In this embodiment, a metal layer is deposited into the via opening 78 into direct contact with an exposed portion of the raised source region 65 and the raise drain region 70. Following deposition, the structure is then subjected to an annealing step using conventional processes such as, but not limited to, rapid thermal annealing. During thermal annealing, the deposited metal reacts with Si forming a metal silicide. The remaining unreacted metal is removed by an etch process selective to silicide. In one embodiment, the raised source and drain regions 65, 70 may be fully silicided. By "fully silicided" it is meant that the entire depth of the epitaxially grown raised source and drain region is intermixed with a metal. The fully silicided raised source and drain region 65, 70 typically includes metal elements intermixed with the semiconductor elements extending from the base surface of the raised source and drain regions 65, 70 that are in contact with the semiconductor substrate 5 to the upper surface of the raised source and drain regions 65, 70. In one example, the raised source region 65 may be referred to as a second source region, and the raised drain region 70 may be referred to as a second drain region. The second source region and the second drain region may have an upper surface that is raised relative to the upper surface of the channel region 4 of the semiconductor substrate 5.

Referring to FIGS. 6A, 6B and 6C, interconnects 85 may be formed in the via openings 78, in which the interconnects 85 are in direct contact with the raised source and drain regions 65, 70 at the base of the via openings 78. Interconnects 85 are formed by depositing a conductive metal into the via openings 78 using a deposition process, such as physical vapor deposition (PVD). Examples of physical vapor deposition (PVD) that are suitable for forming the interconnects 85 include sputtering and plating. Examples of sputtering apparatuses suitable for forming the interconnect 85 include DC diode type systems, radio frequency (RF) sputtering, magnetron sputtering, and ionized metal plasma (IMP) sputtering. The interconnect 85 may also be formed using chemical vapor deposition. The interconnect 85 may be composed of a conductive metal, such as tungsten, copper, aluminum, silver, gold, and alloys thereof.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a semiconductor device comprising:
    forming a gate structure on a semiconductor substrate, wherein a first source region and a first drain region are on opposing sides of the gate structure;
    forming a first spacer in direct contact with sidewalls of the gate structure having a first width that exposes a portion of the first source region and the first drain region;
    forming a second spacer on the sidewalls of the gate structure, wherein the second spacer has a second width that is less than the first width and covers the entire length of the first source region and the first drain region; and
    forming a second source region and a second drain region on the exposed portion of the first source region and the first drain region, the second source region and the second drain region have an upper surface that is raised relative to the channel region of the semiconductor substrate.

2. The method of claim 1, wherein the first source region is a source extension region, the first drain region is a drain extension region, the second source region is a raised source region, the second source region is a raised source region, and the second drain region is a raised drain region.

3. The method of claim 2, wherein the forming of the gate structure comprises a replacement gate structure.

4. The method of claim 3, further comprising:
forming the first spacer in direct contact with sidewalls of the replacement gate structure; implanting the source extension region and the drain extension region in the semiconductor substrate;
forming a sacrificial spacer in direct contact with sidewalls of the first spacer;
implanting a deep source region and a deep drain region in the semiconductor substrate; removing the sacrificial spacer after forming the deep source region and the drain extension region; and
forming a second spacer in direct contact with sidewalls of the first spacer.

5. The method of claim 4, wherein the forming of the second spacer comprises:
depositing a conformal dielectric layer over the first spacer; and
removing at least a portion of the conformal dielectric layer that is overlying the semiconductor substrate that includes the source extension region, drain extension region, deep source region, and deep drain regions, wherein a remaining portion of the conformal dielectric layer provides the second spacer.

6. The method of claim 5, wherein the removing of said at least the portion of the conformal dielectric layer comprises forming an etch mask protecting a second spacer portion of the conformal dielectric layer, and etching an exposed portion of the conformal dielectric layer selective to at least the etch mask.

7. The method of claim 6, wherein the etching to remove the portion of the conformal dielectric layer comprises an anisotropic etch that is selective to at least the etch mask and the first spacer.

8. The method of claim 7, wherein the second spacer is present in direct contact with the middle portion of the first spacer.

9. The method of claim 2, wherein the forming of the raised source region and the raised drain region on the source extension region and the drain extension region includes forming the raised source region and the raised drain region in direct contact with a portion of the source extension region and the drain extension region that is exposed by removing the portion of the conformal dielectric layer.

10. The method of claim 3, further comprising removing the replacement gate structure after forming the raised source region and the raised drain region, and forming a functional gate structure on an exposed portion of the semiconductor substrate that is between the source extension region and the drain extension region.

11. The method of claim 10, further comprising forming an interlevel dielectric layer over the functional gate structure, the raised source region and the raised drain region, and forming interconnects to the raised source region and the raised drain region through the interlevel dielectric layer.

12. A method of forming a semiconductor device comprising:
forming a replacement gate structure on a semiconductor substrate, wherein a first source region and a first drain region are on opposing sides of the gate structure;
forming a first spacer on the sidewalls of the replacement gate structure, wherein the first spacer has a first width that provides an exposed portion of the first source region and the first drain region;
forming a second spacer on the sidewalls of the gate structure, wherein the second spacer has a second width that is less than the first width and covers the entire length of the first source region and the first drain region;
forming a second source region and a second drain region on the exposed portion of the first source region and the first drain region, the second source region and the second drain region have an upper surface that is raised relative to the channel region of the semiconductor substrate; and
replacing the replacement gate structure with a functional gate structure.

13. The method of claim 12, wherein the first source region is a source extension region, the first drain region is a drain extension region, the second source region is a raised source region, the second source region is a raised source region, and the second drain region is a raised drain region.

14. The method of claim 13, wherein the first source region is a source extension region, the first drain region is a drain extension region, the second source region is a raised source region, the second source region is a raised source region and the second drain region is a raised drain region.

15. The method of claim 14, wherein the forming of the second spacer comprises:
depositing a conformal dielectric layer over the first spacer; and
removing at least a portion of the conformal dielectric layer that is overlying the semiconductor substrate that includes the source extension region, drain extension region, deep source region, and deep drain regions, wherein a remaining portion of the conformal dielectric layer provides the second spacer.

16. The method of claim 15, wherein the removing of said at least the portion of the conformal dielectric layer comprises forming an etch mask protecting a second spacer portion of the conformal dielectric layer, and etching an exposed portion of the conformal dielectric layer selective to at least the etch mask.

17. The method of claim 12, further comprising forming an interlevel dielectric layer over the functional gate structure, the raised source region and the raised drain region, and forming interconnects to the raised source region and the raised drain region through the interlevel dielectric layer.

* * * * *